US009078316B2

(12) United States Patent
Chang

(10) Patent No.: US 9,078,316 B2
(45) Date of Patent: Jul. 7, 2015

(54) LED DEVICE WITH BUILT-IN FAST SELF-TEST CIRCUIT

(71) Applicant: Generalplus Technology Inc., Hsinchu (TW)

(72) Inventor: Yu-Chung Chang, Hsinchu (TW)

(73) Assignee: GENERALPLUS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/330,390

(22) Filed: Jul. 14, 2014

(65) Prior Publication Data

US 2015/0022111 A1    Jan. 22, 2015

(30) Foreign Application Priority Data

Jul. 19, 2013    (TW) ............... 102125924 A

(51) Int. Cl.
*H05B 33/08*    (2006.01)
(52) U.S. Cl.
CPC ........ *H05B 33/0815* (2013.01); *H05B 33/0803* (2013.01)

(58) Field of Classification Search
None
See application file for complete search history.

(56) References Cited

U.S. PATENT DOCUMENTS

| | | | | |
|---|---|---|---|---|
| 5,727,207 A | * | 3/1998 | Gates et al. | 713/1 |
| 5,825,777 A | * | 10/1998 | Komarek et al. | 370/458 |
| 2013/0099702 A1 | * | 4/2013 | Williams et al. | 315/363 |
| 2013/0147375 A1 | * | 6/2013 | Williams et al. | 315/192 |

\* cited by examiner

*Primary Examiner* — Crystal L Hammond
(74) *Attorney, Agent, or Firm* — Bacon & Thomas, PLLC

(57) ABSTRACT

An LED device with built-in fast self-test circuit includes at least one LED unit, a data shift and latch register, a control unit, at least one multiplexer, and an LED driver unit. The data shift and latch register receives a serial data signal. The control unit receives the serial data signal to detect whether there is normal data transmission based on the serial data signal. When there is no data transmission, the control unit enables a multiplex control signal. The multiplexer is connected to the control unit and the data shift and latch register. According to the multiplex control signal, the multiplexer selects the control unit or the data shift and latch register as an output. The LED driver unit is connected to at least one LED unit and the multiplexer to drive the LED unit based on the output of the multiplexer.

7 Claims, 3 Drawing Sheets

LED DEVICE WITH BUILT-IN FAST SELF-TEST CIRCUIT

BACKGROUND OF THE INVENTION

1. Field of the Invention

The present invention relates to the technical field of LED test and, more particularly, to a light emitting diode (LED) device with built-in fast self-test circuit.

2. Description of Related Art

In 1995, Rubin Braunstein in the Radio Corporation of America (RCA) first found the infrared radiation from GaAs and other semiconductor alloys. Subsequently, Nick Holonyak Jr. developed the first light emitting diode (LED) for visible light applications in practice.

With the advance of LED technology, the illuminance or usage lifetime of an LED has relatively improved and thus increasingly replaced conventional lights. A cold cathode fluorescent lamp (CCFL) backlight is replaced with an LED backlight, which leads to a simple and concise circuit design and has a higher external force sustainability. Thus, it is more environmentally friendly and vividly displayed as the CCFL backlight of a liquid crystal display (LCD) is replaced with the LED backlight. In addition, when the LED lights replace white lamps, halogen lamps, and the like, it saves more power, becomes brighter, gains longer life, and lights quicker. When the LEDs are used in the brake light of a car, the accident frequency caused by backing a car is reduced. In addition to lighting, most electronic products, such as a motherboard, display card, and network card, use LEDs as indicative lights to indicate the working states of circuit boards.

FIG. 1 is a schematic diagram of a conventional LED test. In FIG. 1, there are a red LED, a blue LED, and a green LED in an LED package 100. A test machine (not shown) controls switches 101, 102, 103 respectively. When the switch 101 is closed, one end of the red LED is grounded and the other end is connected to a high voltage Vdd, thereby lighting the red LED. A spectrometer (not shown) is used to detect the three LEDs by checking whether their saturation is met with the requirement on spectrum.

FIG. 2 is a schematic diagram of a prior LED package 200. In FIG. 2, the LED package 200 has a control and driving circuit 210 to drive respective red, blue and green LEDs based on the data input by the serial input terminal DI. For testing the LED package 200 of FIG. 2, an additional circuit board 220 is required as the prior test machine only provides two signals V+ (with respect to Vdd) and V− (with respect to Gnd). A microprocessor 221 on the circuit board 220 makes use of a serial peripheral interface bus (SPI) to pass one or more test patterns through the DI pin to the control and driving circuit 210.

FIG. 3 is a schematic view of a DIP4 (dual in package 4) package of FIG. 2. FIG. 4 is a schematic view of an SMT6 (surface mount technology 6) package of FIG. 2. Current LED test machines cannot use the input pin DI to control and drive the red, blue and green LEDs in either the DIP4 package or the SMT6 package to thereby ensure the quality. Thus, the external microprocessor 221 is used in a test, but for a large number of LEDs, the testing speed is too slow. Namely, the LED devices in the DIP4 package of FIG. 3 and the SMT6 package of FIG. 4 are tested in semi-automatic manner, which has the disadvantage of very slow testing speed, resulting in relatively slow production.

Therefore, it is desirable to provide an improved LED device to mitigate and/or obviate the aforementioned problems.

SUMMARY OF THE INVENTION

The object of the present invention is to provide a light emitting diode (LED) device with built-in fast self-test circuit, which can save much LED testing time and effectively increase testing efficiency, and which can be used with a current LED test machine.

According to a feature of the invention, a light emitting diode (LED) device with a built-in fast self-test circuit is provided, which includes at least one LED unit, a data shift and latch register, a control unit, at least one multiplexer, and an LED driver unit. The data shift and latch register receives a serial data signal. The control unit receives the serial data signal to detect whether there is normal data transmission based on the serial data signal. When there is no data transmission, the control unit enables a multiplex control signal. The at least one multiplexer is connected to the control unit and the data shift and latch register. According to the multiplex control signal, the at least one multiplexer selects the control unit or the data shift and latch register as an output. The light emitting diode (LED) driver unit is connected to the at least one light emitting diode (LED) unit and the at least one multiplexer to drive the at least one light emitting diode (LED) unit based on the output of the at least one multiplexer.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
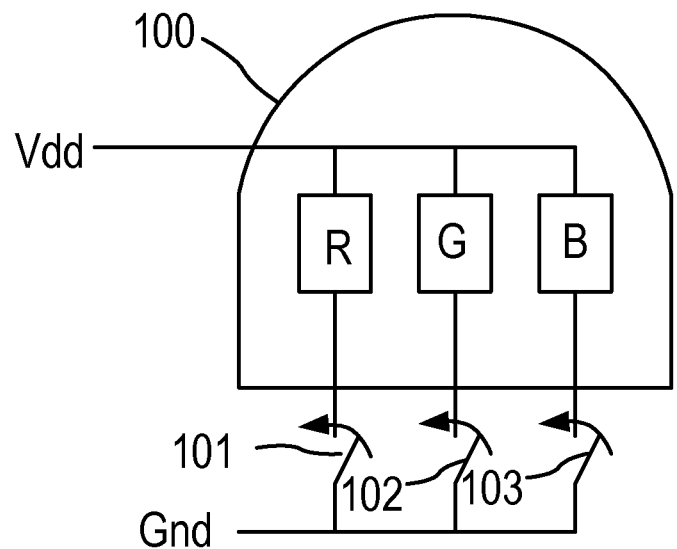
FIG. 1 is a schematic diagram of a prior LED test.
Figure 2:
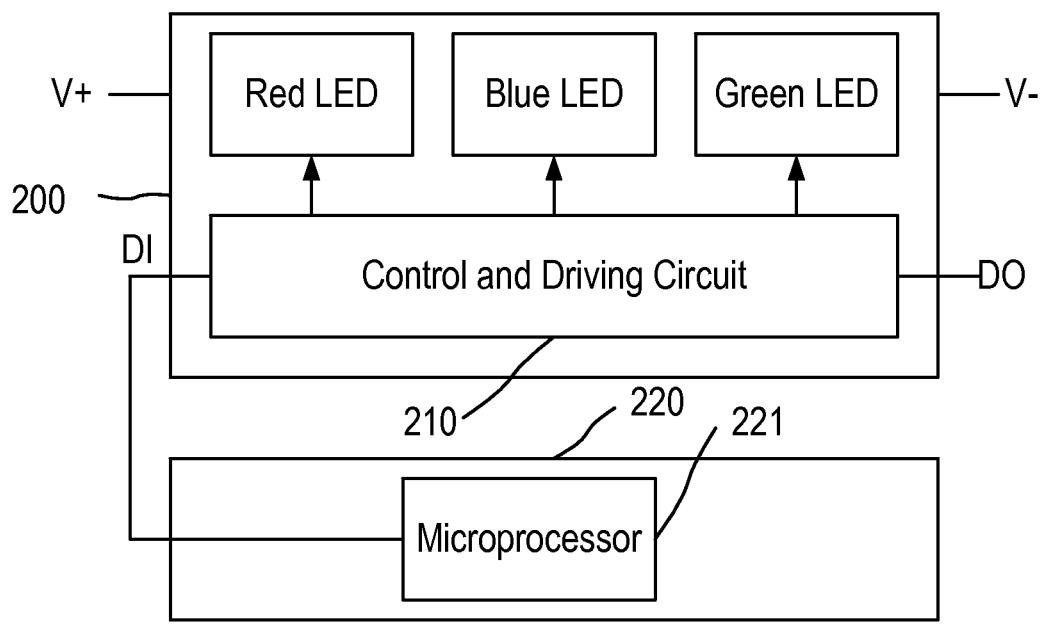
FIG. 2 is a schematic diagram of a prior LED package.
Figure 3:
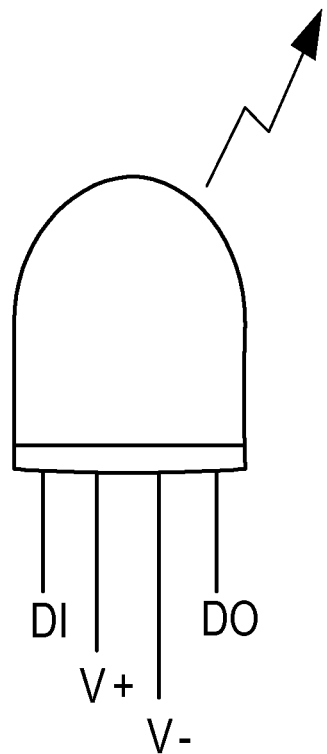
FIG. 3 is a schematic view of a DIP4 package of FIG. 2.
Figure 4:
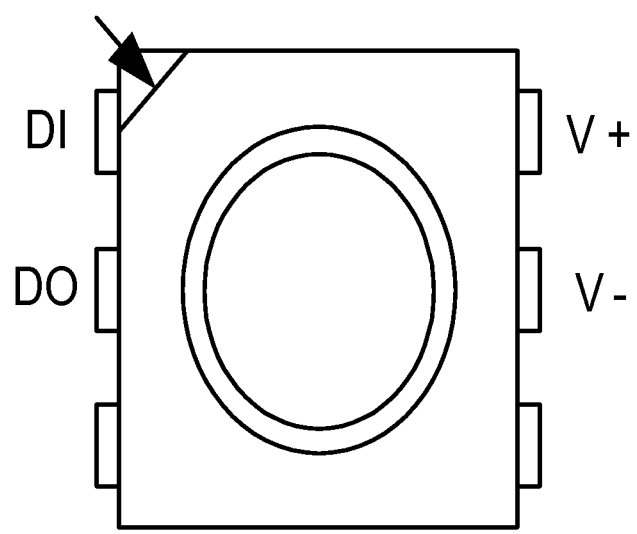
FIG. 4 is a schematic view of a SMT6 package of FIG. 2.
Figure 5:
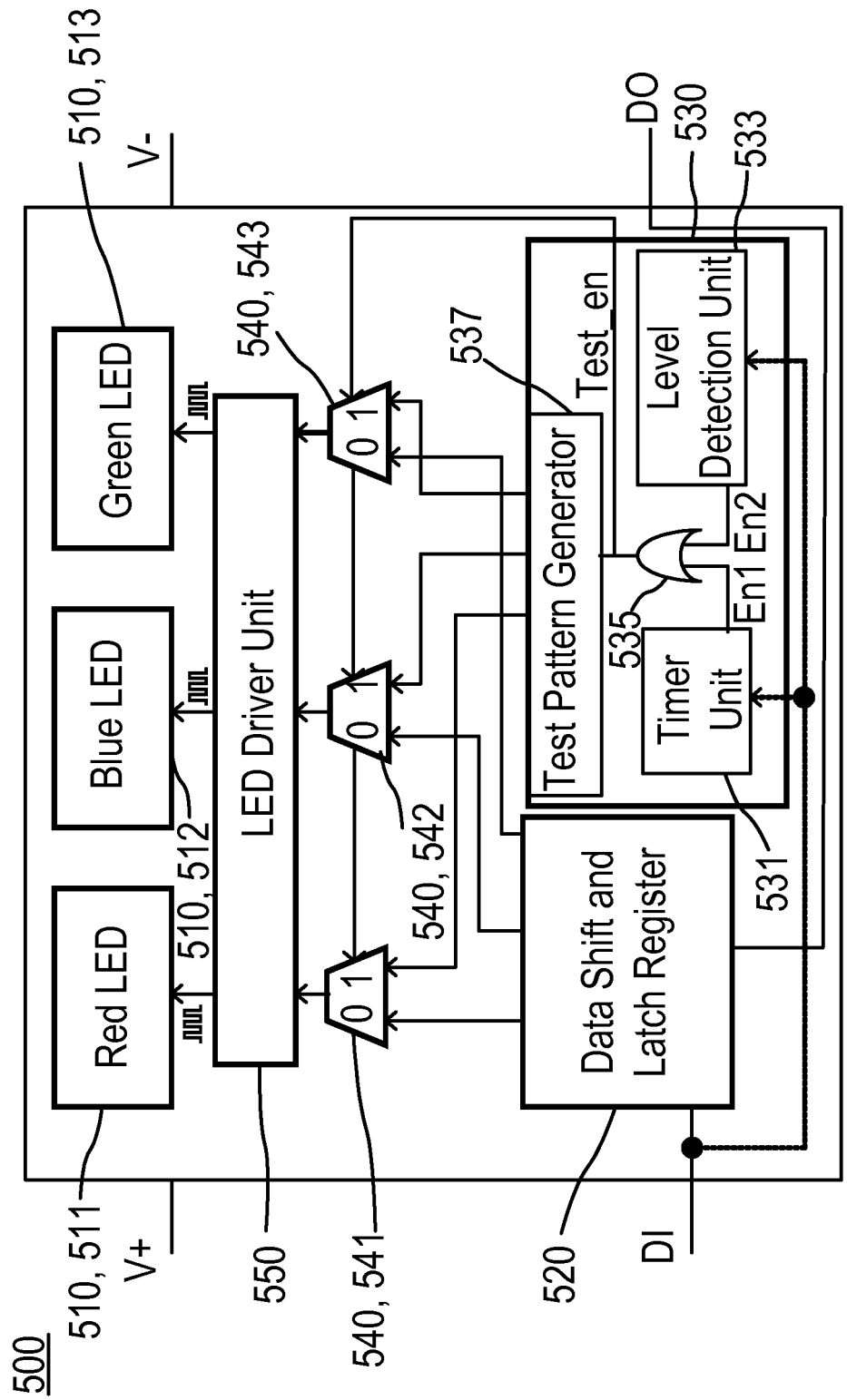
FIG. 5 is a schematic diagram of a light emitting diode (LED) device with built-in fast self-test circuit according to the invention.

FIG. 5 is a schematic diagram of a light emitting diode (LED) device 500 with built-in fast self-test circuit according to the invention, which includes at least one LED unit 510, a data shift and latch register 520, a control unit 530, at least one multiplexer 540, and an LED driver unit 550.

The at least one light emitting diode (LED) unit 510 preferably includes a red LED 511, a blue LED 512, and a green LED 513.

The data shift and latch register 520 receives a serial data signal through a pin DI. The data shift and latch register 520 can perform a shift and latch operation on the serial data signal and output the signal through a pin DO to a next-stage LED device 500.

The control unit 530 receives the serial data signal to detect whether there is normal data transmission based on the serial data signal. When there is no data transmission, the control unit 530 enables a multiplex control signal Test_en.

The present invention essentially provides an automatic test when the LED 500 is not in normal operation. Accordingly, the control unit 530 determines that there is no data transmission when the serial data signal is at a first level (1) and the time of the serial data signal being at the first level is over a normal predetermined time time1. When there is normal data transmission, the test cannot be performed. When there is no normal data transmission, the control unit 530 enables the multiplex control signal Test_en in order to output a test pattern from the at least one multiplexer 540 to the LED driver unit 550 for testing the at least one LED unit 510.

In addition, the serial data signal can be a second level (0) when there is no normal data transmission to the LED device 500. Therefore, when the serial data signal is at the second level (0) and the time of the serial data signal being at the second level is over a predetermined time time2, the control unit determines that there is no normal data transmission, which is another condition to decide that the LED device 500 is not in normal operation.

When there is no normal data transmission to the LED device 500, the serial data signal may also be kept at a level different from the first level (1) or the second level (0). Namely, the level of the serial data signal can be out of the normally applied specification. Therefore, when the serial data signal is not at the first level (1) or the second level (0), the control unit 530 determines that there is no normal data transmission.

The at least one multiplexer 540 is connected to the control unit 530 and the data shift and latch register 520. According to the multiplex control signal Test_en outputted by the control unit 530, the at least one multiplexer 540 selects the data shift and latch register 520 or the control unit 530 as an output. Since the at least one LED 510 preferably includes the red LED 511, the blue LED 512, and the green LED 513, the at least one multiplexer 540 corresponds to the at least one LED unit 510, and thus preferably includes three multiplex units 541, 542, 543 corresponding to the red LED 511, the blue LED 512, the green LED 513, respectively.

The light emitting diode (LED) driver unit 550 is connected to the at least one light emitting diode (LED) unit 510 and the at least one multiplexer 540 in order to drive the at least one light emitting diode (LED) unit 510 based on the output of the at least one multiplexer 540. Namely, when the multiplex control signal Test_en is enabled (=1), the at least one multiplexer 540 outputs the test pattern generated by the control unit 530 for performing a test. When the multiplex control signal Test_en is not enabled (=0), the at least one multiplexer 540 outputs the data latched by the data shift and latch register 520 for performing a normal data operation.

As shown in FIG. 5, the control unit 530 includes a timer unit 531, a level detection unit 533, an OR gate 535, and a test pattern generator 537.

The timer unit 531 receives the serial data signal and generates a first enable signal en1 based on the serial data signal. When the serial data signal is at the first level (1) and the time of the serial data signal being at the first level is over the predetermined time time1, the timer unit 531 generates a first enable signal en1, or, when the serial data signal is at the second level (0) and the time of the serial data signal being at the second level is over the predetermined time time2, the timer unit 531 generates a first enable signal en1.

The level detection unit 533 receives the serial data signal and generates a second enable signal en2 based on the serial data signal. That is, when the serial data signal is kept at a level out of the normally applied specification, it indicates that the LED device 500 is not in normal operation and thus the level detection unit 533 generates the second enable signal en2.

The OR gate 535 is connected to the timer unit 531 and the level detection unit 533 in order to generate the multiplex control signal Test_en based on the first enable signal en1 and the second enable signal en2, i.e., Test_en<=en1 or en2.

The test pattern generator 537 is connected to the OR gate 535 and the at least one multiplexer 540 in order to output the test pattern to the at least one multiplexer 540 when the multiplex control signal Test_en is enabled (=1).

The LED driver unit 550 uses a pulse width modulation (PWM) to drive the at least one LED unit 510 to generate a gray level.

In view of the foregoing, it is known that the present invention uses the built-in test pattern generator 537 to output one or more test patterns for an automatic test when the LED device 500 is not in normal operation. Thus, there is no need of using an external microprocessor to input the test patterns through the SPI, which inputs data quite slow. Therefore, the present invention can save much LED testing time and effectively increase testing efficiency, and can be used with a current LED test machine.

Although the present invention has been explained in relation to its preferred embodiment, it is to be understood that many other possible modifications and variations can be made without departing from the spirit and scope of the invention as hereinafter claimed.

What is claimed is:

1. An LED device with built-in fast self-test circuit, comprising:
    at least one LED unit;
    a data shift and latch register for receiving a serial data signal;
    a control unit for receiving the serial data signal to detect whether there is normal data transmission based on the serial data signal, and enabling a multiplex control signal when there is no data transmission;
    at least one multiplexer connected to the control unit and the data shift and latch register for selecting the control unit or the data shift and latch register as an output based on the multiplex control signal; and
    an LED driver unit connected to the at least one LED unit and the at least one multiplexer for driving the at least one LED unit based on the output of the at least one multiplexer.

2. The LED device with built-in fast self-test circuit as claimed in claim 1, wherein the control unit determines that there is no normal data transmission when the serial data signal is at a first level (1) and time of the serial data signal being at the first level is over a first predetermined time.

3. The LED device with built-in fast self-test circuit as claimed in claim 1, wherein the control unit determines that there is no normal data transmission when the serial data signal is at a second level (0) and time of the serial data signal being at the second level is over a second predetermined time.

4. The LED device with built-in fast self-test circuit as claimed in claim 1, wherein the control unit determines that there is no normal data transmission when the serial data signal is at a level different from the first level (1) or the second level (0).

5. The LED device with built-in fast self-test circuit as claimed in claim 1, wherein the control unit comprises:
    a timer unit for receiving the serial data signal to generate a first enable signal based on the serial data signal;
    a level detection unit for receiving the serial data signal to generate a second enable signal based on the serial data signal;
    an OR gate connected to the timer unit and the level detection unit for generating the multiplex control signal based on the first enable signal and the second enable signal; and
    a test pattern generator connected to the OR gate and the at least one multiplexer for outputting one or more test patterns to the at least one multiplexer when the multiplex control signal is enabled.

6. The LED device with built-in fast self-test circuit as claimed in claim 5, wherein the LED driver unit uses a pulse width modulation to drive the at least one LED unit to generate a gray level.

7. The LED device with built-in fast self-test circuit as claimed in claim 6, wherein the at least one LED unit is selectively to be a red LED, a blue LED, and a green LED.

* * * * *